US010250332B2

(12) United States Patent
Cevrero et al.

(10) Patent No.: US 10,250,332 B2
(45) Date of Patent: Apr. 2, 2019

(54) VCSEL BASED OPTICAL LINKS IN BURST MODE

(71) Applicant: International Business Machines Corporation, Armonk, NY (US)

(72) Inventors: Alessandro Cevrero, Oberrieden (CH); Daniel M. Kuchta, Patterson, NY (US); Christian I. Menolfi, Langnau am Albis (CH); Thomas E. Morf, Gross (CH); Ilter Özkaya, Adliswil (CH); Marc A. Seifried, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/478,789

(22) Filed: Apr. 4, 2017

(65) Prior Publication Data

US 2018/0287707 A1 Oct. 4, 2018

(51) Int. Cl.
*H04B 10/00* (2013.01)
*H04B 10/50* (2013.01)
*H04Q 11/00* (2006.01)
*H04B 10/508* (2013.01)
*H04B 10/564* (2013.01)

(52) U.S. Cl.
CPC ......... *H04B 10/503* (2013.01); *H04B 10/508* (2013.01); *H04B 10/564* (2013.01); *H04Q 11/0003* (2013.01); *H04B 2210/08* (2013.01)

(58) Field of Classification Search
CPC .. H04B 10/503; H04B 10/564; H04B 10/508; H04B 2210/08; H04Q 11/0003
See application file for complete search history.

(56) References Cited

U.S. PATENT DOCUMENTS

| 5,012,113 | A | * | 4/1991 | Valentine | H04B 10/11 136/291 |
| 5,369,656 | A | * | 11/1994 | Ackley | H04B 10/25 398/141 |
| 5,485,300 | A | * | 1/1996 | Daley | H04B 10/272 372/30 |
| 6,061,155 | A | * | 5/2000 | Meyer | H04B 10/60 398/107 |
| 7,333,733 | B2 | * | 2/2008 | Taylor | H01L 29/155 257/E21.387 |

(Continued)

OTHER PUBLICATIONS

"Application Note: Modulating VCSELs," Finisar Advanced Optical Components Division, 2007, pp. 1-15.

(Continued)

*Primary Examiner* — Agustin Bello
(74) *Attorney, Agent, or Firm* — Daniel P. Morris, Esq.; Hoffmann & Baron, LLP

(57) ABSTRACT

Devices and methods are provided to reduce the wake-up time of a Vertical Cavity Surface Emitting Laser (VCSEL) used in a data communication link. For example, in one aspect, a method for optical communications includes, in an optical communication device including a light-emitting device, applying a bias current to the light-emitting device and transmitting a pulse to the light-emitting device before transmitting a preamble signal or data signal to the light-emitting device, wherein the pulse has a voltage greater than a highest voltage of the preamble signal or data signal.

23 Claims, 4 Drawing Sheets

(56) References Cited

U.S. PATENT DOCUMENTS

| | | | | |
|---|---|---|---|---|
| 7,603,422 B2* | 10/2009 | Murphy | ............... | H04L 51/12 |
| | | | | 709/206 |
| 7,659,535 B2* | 2/2010 | Bozso | ............... | H01S 5/0428 |
| | | | | 257/186 |
| 7,869,707 B2* | 1/2011 | Hampel | ............... | G01R 15/22 |
| | | | | 398/15 |
| 8,879,594 B2* | 11/2014 | Dvir | ............... | H04B 10/564 |
| | | | | 372/38.02 |
| 8,989,227 B1* | 3/2015 | Yang | ............... | H01S 5/0427 |
| | | | | 372/29.011 |
| 9,705,283 B1* | 7/2017 | Deppe | ............... | H01S 5/187 |
| 2004/0081467 A1* | 4/2004 | Taylor | ............... | H01L 29/155 |
| | | | | 398/161 |
| 2004/0160996 A1* | 8/2004 | Giorgi | ............... | H01S 5/042 |
| | | | | 372/25 |
| 2006/0188254 A1* | 8/2006 | Schorpp | ............... | H04B 10/1143 |
| | | | | 398/33 |
| 2008/0304527 A1 | 12/2008 | Gao et al. | | |
| 2009/0202238 A1* | 8/2009 | Straub | ............... | H04B 10/27 |
| | | | | 398/25 |
| 2009/0245788 A1* | 10/2009 | Varshneya | ............... | G01S 7/481 |
| | | | | 398/33 |
| 2010/0111523 A1* | 5/2010 | Hirth | ............... | H04B 10/27 |
| | | | | 398/25 |
| 2010/0142976 A1* | 6/2010 | Uemura | ............... | G02B 6/4201 |
| | | | | 398/183 |
| 2012/0051751 A1* | 3/2012 | Pitzer | ............... | H04J 3/1694 |
| | | | | 398/98 |
| 2012/0070158 A1* | 3/2012 | Allee | ............... | G06K 19/07766 |
| | | | | 398/182 |
| 2012/0288279 A1* | 11/2012 | Zhang | ............... | H04B 10/272 |
| | | | | 398/66 |
| 2014/0341593 A1* | 11/2014 | Van Veen | ............... | H04B 10/272 |
| | | | | 398/201 |

OTHER PUBLICATIONS

Xiao-Xia Zhang, et al., "Turn-on Delay of VCSEL and Effect of Carrier Recombination," Proc. SPIE 4905, Materials and Devices for Optical and Wireless Communications, 567 (Aug. 30, 2002); doi:10.1117/12.480967 (Abstract).

* cited by examiner

VCSEL BASED OPTICAL LINKS IN BURST MODE

BACKGROUND

The present invention relates to techniques for reducing the wake-up time of a light-emitting device, such as a Vertical Cavity Surface Emitting Laser (VCSEL), used in a data communication link.

Typically, in optical and electrical data communication links the utilization is mainly in burst mode. Thus, the link may be idle most of the time. For example, in a typical data center, data communication links may be idle 90% of the time. In order to save power, it would be advantageous to put the link into "sleep mode" during periods where the channel is idle. In an optical link in sleep mode, the transmit circuitry and the laser driver may be partly turned off. In addition, in optical links that use Vertical Cavity Surface Emitting Lasers (VCSELs), the bias current to the VCSEL device may be reduced. The VCSEL is a type of semiconductor laser diode in which the laser beam is emitted perpendicularly from the top surface of the device.

However, a problem arises when the data communication links are taken out of sleep mode. Even if the laser bias is kept above the lasing threshold, the "wake-up" of a VCSEL may require a significant length of time. For example, after a prolonged period of reduced bias or low voltage input data signal (logic zero), when the laser bias is increased or a high voltage data signal (logic one) is applied, the amplitude of the optical signal produced by the VCSEL may increase relatively slowly, and may take as long as 20 ns to 40 ns to reach full amplitude. Typically, the receiver at the other end of the data communication link cannot lock on such a signal, so the data communication link cannot transmit usable data for as long as 20 ns to 40 ns.

Typical data packets are short. For example, typical Ethernet packets may be between 10 ns to 256 ns at 56 GB/s. A 20 ns to 40 ns startup time, plus a 20 ns preamble to synch the receiver may result in an overhead of, for example, 23% to 600%, depending on the packet length.

Accordingly, a need arises for techniques for decreasing the wake-up time of a VCSEL used in a data communication link.

SUMMARY

Embodiments of the present invention may provide the capability to reduce the wake-up time of a light-emitting device, such as a Vertical Cavity Surface Emitting Laser, (VCSEL) used in a data communication link. For example, embodiments may provide the capability to provide a bias boost to the light-emitting device in the first few ns before data transmission starts. For example, this "wake-up pulse" may be higher amplitude than a high voltage data signal and may be at least a few ns in duration. Such a pulse may significantly reduce the startup time of the light-emitting device.

For example, in an embodiment, a method for optical communications may comprise, in an optical communication device comprising a light-emitting device, applying a bias current to the light-emitting device and transmitting a pulse to the light-emitting device after longer periods of inactivity, reduced bias or longer periods of logic zero, before transmitting a preamble signal or data signal to the light-emitting device, wherein the pulse may have a voltage equal to or greater than a highest voltage of the preamble signal or data signal.

In an embodiment, the light-emitting device may be a semiconductor laser. The semiconductor laser may be a Vertical Cavity Surface Emitting Laser. A time for an optical output of the light-emitting device to reach full amplitude when the pulse is transmitted may be reduced compared to a time for an optical output of the light-emitting device to reach full amplitude when the pulse is not transmitted. The time for the optical output of the light-emitting device to reach full amplitude when the pulse is transmitted may be reduced by approximately 10 nanoseconds to 40 nanoseconds. An optical output of the light-emitting device may be coupled to a receiver, and a time for an optical output of the light-emitting device to reach an amplitude at which the receiver can sync to the optical output of the light-emitting device when the pulse is transmitted may be reduced compared to a time for the optical output of the light-emitting device to reach an amplitude at which the receiver can sync to the optical output of the light-emitting device when the pulse is not transmitted. The bias current in the optical communication device in which the pulse is transmitted may be reduced to save power compared to a bias current that is applied in an optical communication device in which the pulse is not transmitted. The bias current may be generated by a bias current source and the pulse may be generated by the bias current source. The bias current may be generated by a bias current source and the pulse may be generated by circuitry other than the bias current source. The pulse may be generated by a voltage multiplier circuit.

For example, in an embodiment, an optical communication device may comprise a light-emitting device, a bias current source adapted to apply a bias current to the light-emitting device, and a pulse generator adapted to generate and transmit a pulse to the light-emitting device before a preamble signal or data signal is transmitted to the light-emitting device, wherein the pulse may have a voltage equal to or greater than a highest voltage of the preamble signal or data signal.

For example, in an embodiment, a computer program product for performing optical communication may comprise a non-transitory computer readable storage having program instructions embodied therewith, the program instructions executable by a computer, to cause the computer to perform a method comprising in an optical communication device comprising a light-emitting device and a bias circuit, applying a bias current to the light-emitting device and transmitting a pulse to the light-emitting device before transmitting a preamble signal or data signal to the light-emitting device, wherein the pulse may have a voltage equal to or greater than a highest voltage of the preamble signal or data signal. The light-emitting device may be a semiconductor laser. The semiconductor laser may be a Vertical Cavity Surface Emitting Laser.

BRIEF DESCRIPTION OF THE DRAWINGS

The details of the present invention, both as to its structure and operation, can best be understood by referring to the accompanying drawings, in which like reference numbers and designations refer to like elements.

DETAILED DESCRIPTION

Embodiments of the present invention may provide the capability to reduce the wake-up time of a light-emitting device, such as a Vertical Cavity Surface Emitting Laser (VCSEL) used in a data communication link. Although for simplicity, this document explicitly describes embodiments including VCSELs, these descriptions are merely examples. In embodiments, examples of light-emitting devices may include, but are not limited to light emitting diodes (LEDs) and semiconductor lasers, as well as VCSELs. For example, embodiments may provide the capability to provide a bias boost to the VCSEL in the first few ns before data transmission starts. For example, this "wake-up pulse" may be higher amplitude than a high voltage data signal and may be at least a few ns in duration. Such a pulse may significantly reduce the startup time of the VCSEL.

Figure 1:
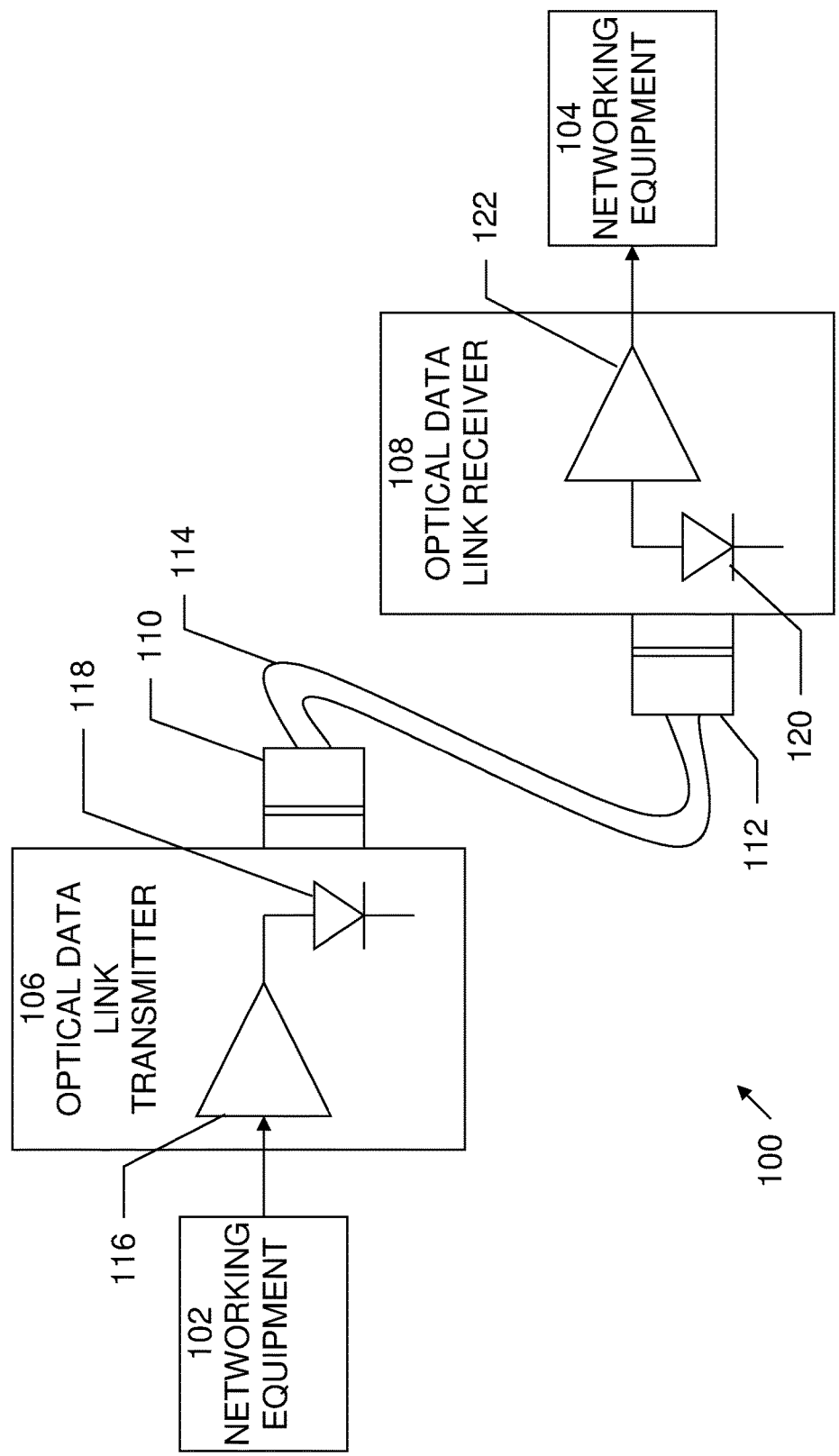
FIG. 1 is an exemplary block diagram of an optical communication network, in which embodiments of the present devices and methods may be implemented.

An exemplary block diagram of an optical communication network 100, in which embodiments of the present devices and methods may be implemented, is shown in FIG. 1. In this example, for simplicity, a uni-directional optical data communication link is shown. However, the present devices and methods are equally applicable to bi-directional optical data communication links.

Network 100 includes networking equipment 102, 104, optical data link transmitter 106, optical data link receiver 108, optical connectors 110, 112, and optical fiber 114. Networking equipment 102, 104 may include any type of computing and communication equipment that may be connected to a data communication network. Optical data link transmitter 106 may be communicatively connected to networking equipment 102 and may receive electrical signals carrying data communication traffic. Optical data link transmitter 106 may convert the electrical signals to optical signals carrying the data communication traffic, and transmit the optical signals carrying the received data communication traffic over optical fiber 114. Optical fiber 114 may be used as the transmission path between optical data link transmitter 106 and optical data link receiver 108. Optical data link receiver 108 may receive the optical signals carrying data communication traffic, may convert the optical signals carrying data communication traffic to electrical signals carrying the data communication traffic, and may transmit the electrical signals carrying the data communication traffic to networking equipment 104. Optical connectors 110, 112 may connect optical fiber 114 to optical data link transmitter 106 and optical data link receiver 108.

Optical data link transmitter 106 may include components such as driver circuitry 116 and laser diode or light emitting diode 118. Driver circuitry 116 may include circuitry to convert the received electrical signals carrying data communication traffic into electrical signals to be applied to laser diode or light emitting diode 118, in order to drive laser diode or light emitting diode 118 to output the optical signals carrying the data communication traffic. Laser diode or light emitting diode 118 may be a semiconductor device designed to output an optical signal when an electrical signal is applied. For example, laser diode or light emitting diode 118 may be a VCSEL. Driver circuitry 116 may also include circuitry to provide a bias current and/or a wakeup pulse to a laser diode, such as a VCSEL.

Optical data link receiver 108 may include components such as photodiode 120 and receiving circuitry 122. Photodiode 120 may be a semiconductor device designed to output an electrical signal when an optical signal is applied, and may be used to convert the received optical signals carrying data communication traffic into electrical signals carrying data communication traffic. Receiving circuitry 122 may include circuitry to convert the received electrical signals carrying data communication traffic into electrical signals to be transmitted to networking equipment 104.

Figure 2:
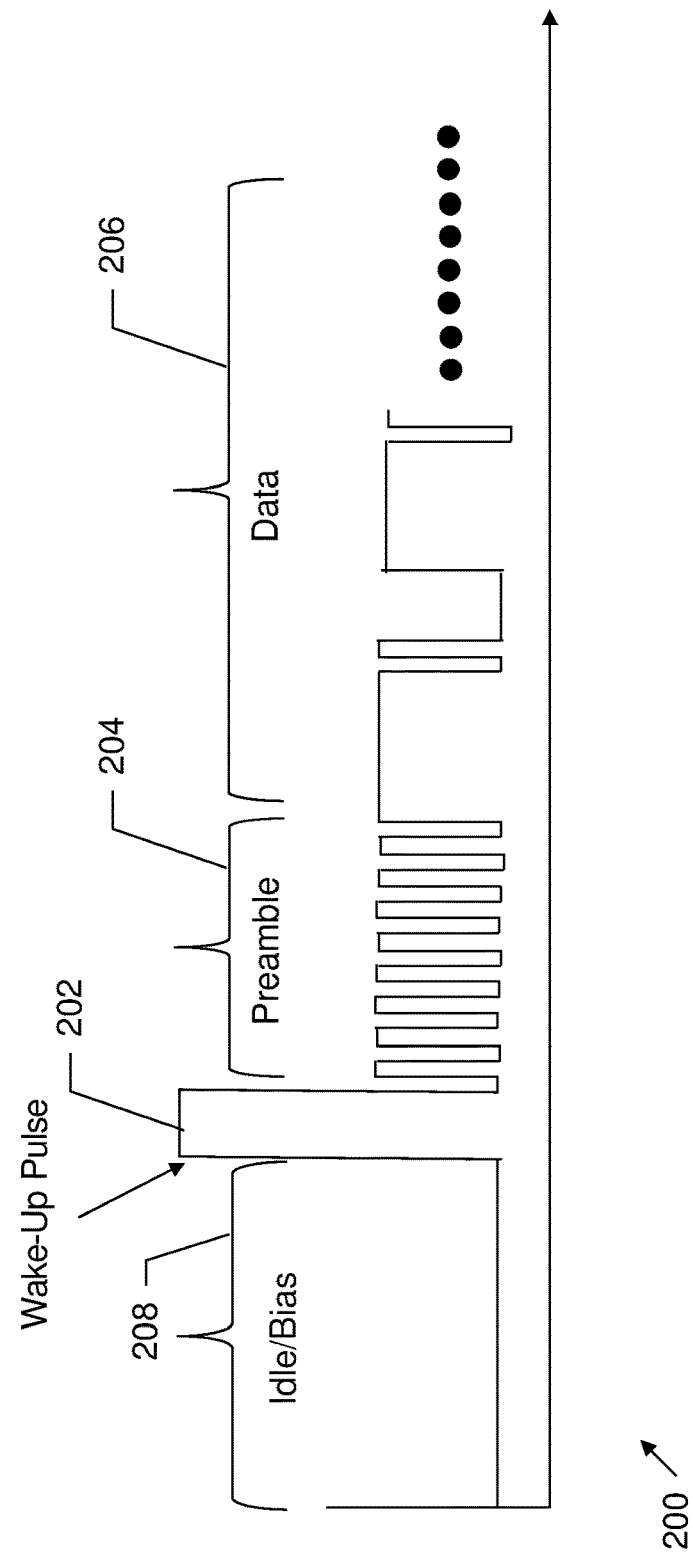
FIG. 2 is an exemplary diagram of an electrical input signal that may be input to a light-emitting device.

An exemplary electrical input signal 200 that may be input to a VCSEL, such as by driver circuitry 116, is shown in FIG. 2. It is best viewed in conjunction with FIG. 1. In this example, signal 200 includes a number of portions—wake-up pulse 202, preamble 204, data 206, and idle or bias signal 208. Data 206 may be the portion of input signal 200 that carries data communication traffic. Preamble 204 is typically a pattern of data bits, "1s" and "0s", that has been selected to allow receiving circuitry 122 to synch to, or lock on to, the optical signal after an idle period 208. Wake-up pulse 202 may add a bias boost for a few nanoseconds, which may cause the output optical signal from the VCSEL 118 to reach a usable amplitude more quickly than it would without such as wake-up pulse. Such a wake-up pulse may be implemented, for example, using a bias circuit with modulation capabilities.

Figure 3:
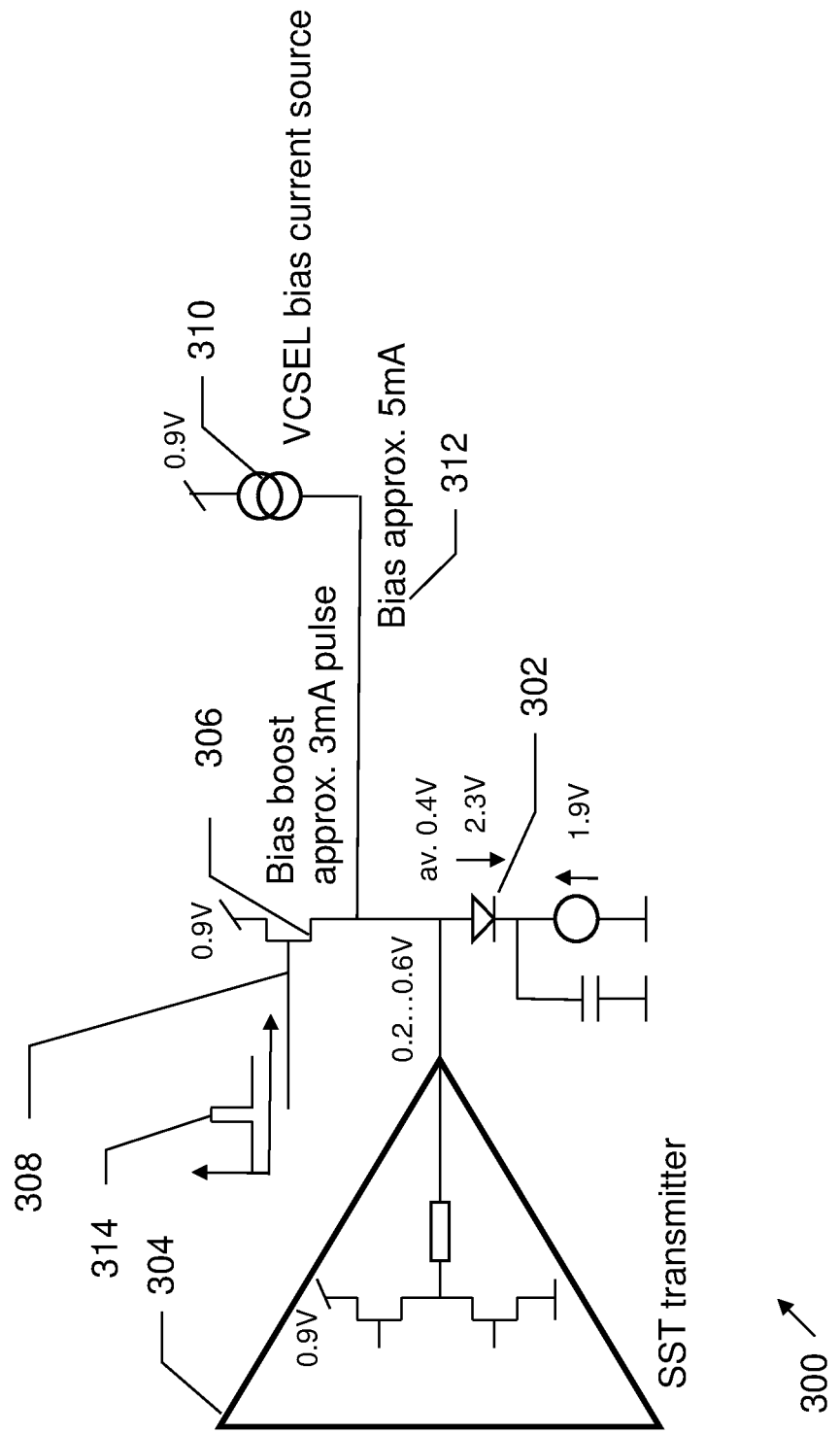
FIG. 3 is an exemplary schematic diagram of an embodiment of circuitry that may be used to implement application of a wake-up pulse to a light-emitting device.

An exemplary schematic diagram of an embodiment of circuitry 300 that may be used to implement application of a wake-up pulse to a VCSEL is shown in FIG. 3. Circuitry 300 may include VCSEL 302 and other circuitry that may be included in driver circuitry, such as SST transmitter 304, wake-up pulse switch 306, wake-up pulse input 308, and VCSEL bias current source 310. SST transmitter 304 may transmit an electrical signal carrying data communication traffic, and which may be used to control an optical signal output of VCSEL 302. VCSEL bias current source 310 may be a constant current source and may provide a constant bias current 312 to bias VCSEL 302. Wake-up pulse input 308 may receive a wake-up pulse control signal 314 and activate wake-up pulse switch 306 to provide a wake-up pulse to VCSEL 302. In this example, the wake-up pulse may be in the form of a bias boost pulse. Wake-up pulse control signal 314 may be generated by circuitry with the proper timing to apply the wake-up pulse immediately before the preamble is to be transmitted. In this embodiment, the wake-up pulse may have a voltage that is close to the circuit supply voltage, but which is higher than the voltage of a high voltage data signal. In this example, the wake-up pulse may have a voltage of approximately 0.9 volts, or approximately 0.5 volts above the average data signal level, or approximately 0.3 volts above the high voltage data signal. With a bias current of approximately 5 mA, this may cause the wake-up pulse to be approximately 3 mA. Likewise, in this example the wake-up pulse may be approximately 2 ns to 4 ns in duration. One of ordinary skill in the art would recognize that these values are merely examples based on the particular circuitry and device characteristics shown in FIG. 3, and that the present devices and methods are equally applicable to other circuit configurations, pulse durations, and voltage and current values.

Figure 4:
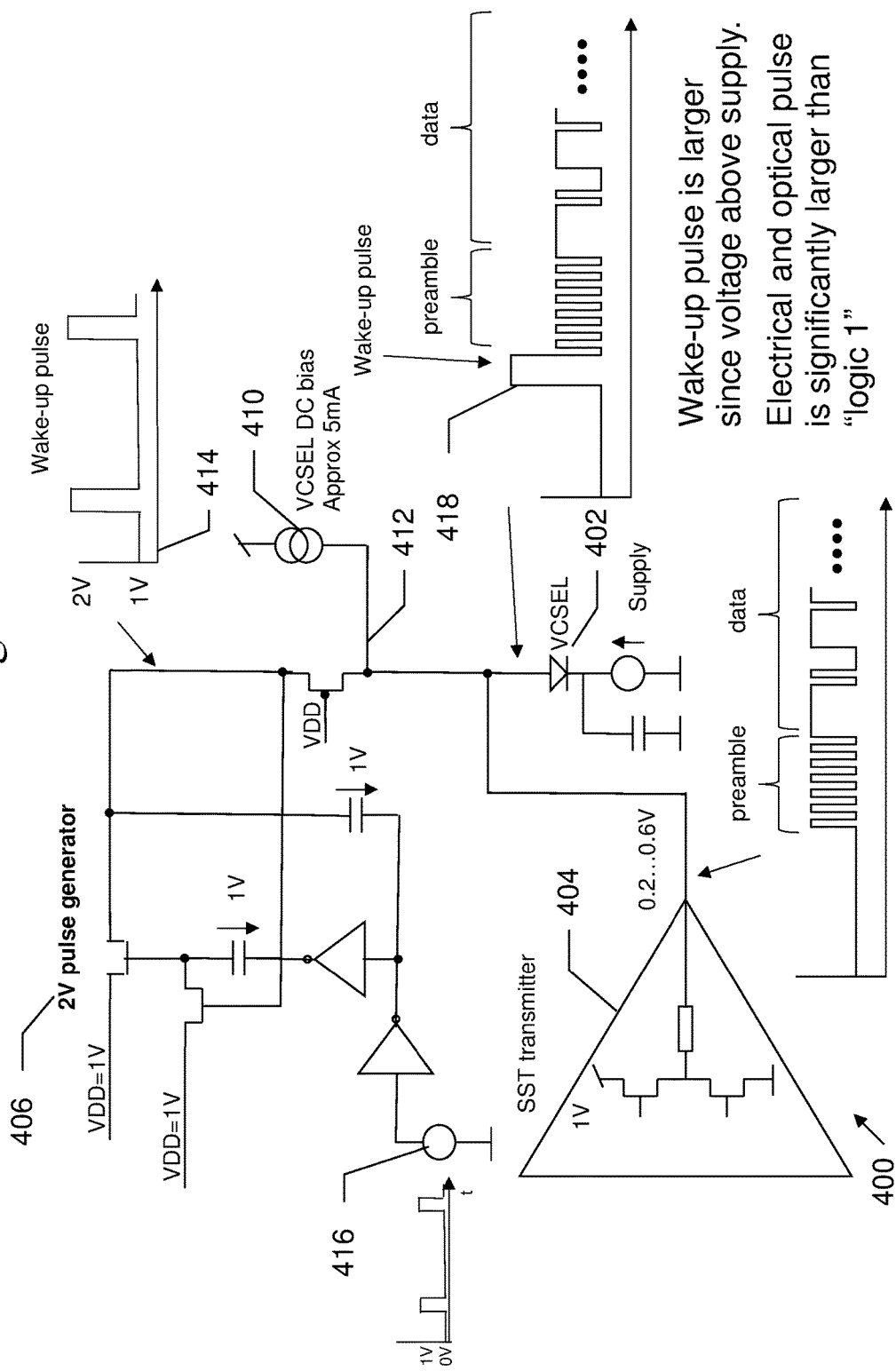
FIG. 4 is an exemplary schematic diagram of an embodiment of circuitry that may be used to implement application of a wake-up pulse to a light-emitting device.

An exemplary schematic diagram of an embodiment of circuitry 400 that may be used to implement application of a wake-up pulse to a VCSEL is shown in FIG. 4. Circuitry 400 may include VCSEL 402 and other circuitry that may be included in driver circuitry, such as SST transmitter 404, wake-up pulse generator 406, and VCSEL bias current source 410. SST transmitter 404 may transmit an electrical signal carrying data communication traffic, and which may be used to control an optical signal output of VCSEL 402.

VCSEL bias current source 410 may be a constant current source and may provide a constant bias current 412 to bias VCSEL 402. Wake-up pulse generator 406 may generate a wake-up pulse 414 based on a wake-up pulse control signal generated by wake-up pulse control signal generator 416. Wake-up pulse generator 406 may generate the wake-up pulse with the proper timing to apply the wake-up pulse immediately before the preamble is to be transmitted. Wake-up pulse 414 may be combined with bias current 412 and the data signal from SST transmitter 404 to generate a signal that includes the wake-up pulse, data signal, and bias current and that is applied to VCSEL 402.

In this embodiment, the wake-up pulse may have a voltage that is higher than the circuit supply voltage, and accordingly, which is higher than the voltage of a high voltage data signal. For example, wake-up pulse generator 406 may include a switched capacitor voltage doubler so as to provide a wake-up pulse voltage of approximately twice the circuit supply voltage. In this example, Wake-up pulse generator 406 may produce a pulse of approximately one volt above the supply voltage, or greater, which may be applied to VCSEL 402 after an extensive period of reduced bias or low voltage data signal. Likewise, the optical power level output during the wake-up pulse may be greater than the optical power level output for a high voltage data signal. Other configurations and voltage multiplication techniques may be used in addition, or as an alternative to, the exemplary circuitry. In this example, the wake-up pulse may have a voltage of approximately 2 volts, which is above the average data signal level, and which is above the high voltage data signal. With a bias current of approximately 5 mA, this may cause the wake-up pulse current to provide a significant boost. Likewise, in this example the wake-up pulse may be approximately 2 ns to 4 ns in duration. One of ordinary skill in the art would recognize that these values are merely examples based on the particular circuitry shown in FIG. 4, and that the present devices and methods are equally applicable to other circuit configurations, pulse durations, and voltage and current values.

The circuitry shown in FIGS. 3 and 4 may be implemented in any circuit technology. For example, such circuitry may be implemented with thin oxide, 1 volt devices. As VCSEL 402 may still be relatively cold, thermal rollover does not happen during the wake-up pulse due to thermal time constants. During the wake-up pulse, the output optical pulse may grow significantly over time. However, VCSEL 402 may handle these pulses without reliability issues.

Additional embodiments may, for example, include circuitry for a common anode VCSEL. In this example, the circuitry may be mirrored. In another example, the pulse generator may be incorporated into the bias current source. In this example, such a pulse generator may be implemented as a current mirror, and the reference current may be switched to maximum for a few nanoseconds to generate the wake-up pulse. In another example, the SST transmitter may be switched into a high impedance mode during the wake-up pulse to minimize the parallel current path.

The present invention may be a system, a method, and/or a computer program product at any possible technical detail level of integration. The computer program product may include a computer readable storage medium (or media) having computer readable program instructions thereon for causing a processor to carry out aspects of the present invention. The computer readable storage medium can be a tangible device that can retain and store instructions for use by an instruction execution device.

The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for optical communications, comprising:
in an optical communication device comprising a transmitter including a light-emitting device, applying a bias current to the light-emitting device; and
transmitting a pulse as an input to the light-emitting device before transmitting a preamble signal or data signal to the light-emitting device, wherein the pulse has a voltage equal to or greater than a highest voltage of the preamble signal or data signal;
wherein a time for an optical output of the light-emitting device to reach full amplitude when the pulse is transmitted is reduced compared to a time for an optical output of the light-emitting device to reach full amplitude when the pulse is not transmitted.

2. The method of claim 1, wherein the light-emitting device is a semiconductor laser.

3. The method of claim 2, wherein the semiconductor laser is a Vertical Cavity Surface Emitting Laser.

4. The method of claim 1, wherein the time for the optical output of the light-emitting device to reach full amplitude when the pulse is transmitted is reduced by approximately 10 nanoseconds to 40 nanoseconds.

5. A method for optical communications, comprising:
in an optical communication device comprising a transmitter including a light-emitting device, applying a bias current to the light-emitting device; and
transmitting a pulse as an input to the light-emitting device before transmitting a preamble signal or data signal to the light-emitting device, wherein the pulse has a voltage equal to or greater than a highest voltage of the preamble signal or data signal;
wherein an optical output of the light-emitting device is coupled to a receiver, and a time for an optical output of the light-emitting device to reach an amplitude at which the receiver can sync to the optical output of the light-emitting device when the pulse is transmitted is reduced compared to a time for the optical output of the light-emitting device to reach an amplitude at which the receiver can sync to the optical output of the light-emitting device when the pulse is not transmitted.

6. The device of claim 5, wherein the time for the optical output of the light-emitting device to reach an amplitude after longer periods of reduced bias or longer periods of logic zeros, at which the receiver can sync to the optical output of the light-emitting device when the pulse is transmitted is reduced by approximately 10 nanosecond to 40 nanoseconds.

7. The method of claim 1, wherein the bias current in the optical communication device in which the pulse is transmitted is reduced during periods of no data to save power, compared to a bias current that is applied in an optical communication device in which the pulse is not transmitted.

8. The method of claim 1, wherein the bias current is generated by a bias current source and the pulse is generated by the bias current source.

9. The method of claim 1, wherein the bias current is generated by a bias current source and the pulse is generated by circuitry other than the bias current source.

10. The method of claim 1, wherein the pulse is generated by a voltage multiplier circuit.

11. An optical transmitter device, comprising:
a light-emitting device;
a bias current source adapted to apply a bias current to the light-emitting device; and
a pulse generator adapted to generate and transmit a pulse as an input to the light-emitting device before a preamble signal or data signal is transmitted to the light-emitting device, wherein the pulse has a voltage equal to or greater than a highest voltage of the preamble signal or data signal;

wherein the bias current in the optical transmitter device in which the pulse is transmitted is reduced compared to a bias current that is applied in an optical communication device in which the pulse is not transmitted.

12. The device of claim 11, wherein the light-emitting device is a semiconductor laser.

13. The device of claim 12, wherein the semiconductor laser is a Vertical Cavity Surface Emitting Laser.

14. An optical communication device, comprising:
a light-emitting device;
a bias current source adapted to apply a bias current to the light-emitting device; and
a pulse generator adapted to generate and transmit a pulse to the light-emitting device before a preamble signal or data signal is transmitted to the light-emitting device, wherein the pulse has a voltage equal to or greater than a highest voltage of the preamble signal or data signal; and
wherein a time for an optical output of the light-emitting device to reach full amplitude when the pulse is transmitted is reduced compared to a time for an optical output of the light-emitting device to reach full amplitude when the pulse is not transmitted.

15. The device of claim 14, wherein the time for the optical output of the light-emitting device to reach full amplitude when the pulse is transmitted is reduced by approximately 10 nanosecond to 40 nanoseconds.

16. The device of claim 15, wherein an optical output of the light-emitting device is coupled to a receiver, and a time for an optical output of the light-emitting device to reach an amplitude at which the receiver can synch to the optical output of the light-emitting device when the pulse is transmitted is reduced compared to a time for the optical output of the light-emitting device to reach an amplitude at which the receiver can synch to the optical output of the light-emitting device when the pulse is not transmitted.

17. The device of claim 16, wherein the time for the optical output of the light-emitting device to reach an amplitude at which the receiver can synch to the optical output of the light-emitting device when the pulse is transmitted is reduced by approximately 10 nanosecond to 40 nanoseconds.

18. The device of claim 11, wherein the bias current is generated by a bias current source and the pulse is generated by the bias current source.

19. The device of claim 11, wherein the bias current is generated by a bias current source and the pulse is generated by circuitry other than the bias current source.

20. The device of claim 11, wherein the pulse is generated by a voltage multiplier circuit.

21. A computer program product for performing optical communication, the computer program product comprising a non-transitory computer readable storage medium having program instructions embodied therewith, the program instructions executable by a computer, to cause the computer to perform a method comprising:
in an optical communication device comprising a transmitter including a light-emitting device and a bias circuit, applying a bias current to the light-emitting device; and
transmitting a pulse as an input to the light-emitting device before transmitting a preamble signal or data signal to the light-emitting device, wherein the pulse has a voltage equal to or greater than a highest voltage of the preamble signal or data signal;
wherein a time for an optical output of the light-emitting device to reach full amplitude when the pulse is transmitted is reduced compared to a time for an optical output of the light-emitting device to reach full amplitude when the pulse is not transmitted.

22. The computer program product of claim 21, wherein the light-emitting device is a semiconductor laser.

23. The computer program product of claim 22, wherein the semiconductor laser is a Vertical Cavity Surface Emitting Laser.

* * * * *